United States Patent [19]

Ohta et al.

[11] 3,858,123

[45] Dec. 31, 1974

[54] NEGATIVE RESISTANCE OSCILLATOR

[75] Inventors: Tomozo Ohta; Syoji Makino, both of Yokohama, Japan

[73] Assignee: Oki Electric Industry Co., Ltd., Tokyo, Japan

[22] Filed: June 22, 1973

[21] Appl. No.: 372,740

[30] Foreign Application Priority Data

June 24, 1972 Japan ................................ 47-62851

[52] U.S. Cl. .................... 331/107 R, 331/96, 333/10
[51] Int. Cl. ............................................. H03b 7/14
[58] Field of Search .............. 331/96, 107 R, 107 G; 333/10

[56] References Cited

UNITED STATES PATENTS 3,465,265 9/1969 Kuru .............................. 331/107 G
3,534,293 10/1970 Harkless .............................. 331/96

*Primary Examiner*—John Kominski
*Attorney, Agent, or Firm*—Sughrue, Rothwell, Mion, Zinn & Macpeak

[57] ABSTRACT

A negative resistance oscillator consisting of two parallel waveguides coupled together by a directional resonator. The electric coupling point between the resonator and the waveguides is spaced $n\lambda/4$ from a negative resistance element mounted near the end of one of the waveguides, where $n$ is an integer and $\lambda$ is the wavelength of the center frequency of the oscillator.

3 Claims, 5 Drawing Figures

NEGATIVE RESISTANCE OSCILLATOR

BACKGROUND OF THE INVENTION

1. Field of the Invention

This invention relates generally to the field of oscillators and, more particularly, to a negative resistance oscillator of high stability and low noise.

2. Description of the Prior Art

Since a negative resistance oscillator using a Gunn impact diode is simple in construction and provides a high power ultra high frequency oscillator, it plays an important role as a power supply in the microwave and milliwave range. However, it has poorer noise characteristics frequency stability than a klystron. A prior art negative resistance oscillator improved with respect to noise stability is shown in FIG. 1, where numeral 1 illustrates a negative resistance element, 2 a mount for the negative resistance element, 3 an output terminal, 4 a transmission type resonator, 5 a stabilizing resistor, and 6 a coaxial transmission line or waveguide.

The mount 2 has the same function as that of the resonator so as to serve to improve the frequency stability and FM noise characteristic. One function of the resonator 4 is to pass only the desired signal frequency component similar to a narrow band filter. The other function of the resonator 4 is to provide a high Q circuit as seen looking from the window of the mount 2 toward the load and, accordingly, toward the output terminal 3. Undesired frequency components are reflected by the resonator 4 and are attenuated by the resistor 5. The oscillating signal output is then taken out from the output terminal 3 which is open.

The signal components other than the center frequency passed by the transmission type resonator 4, that is, the noise components, are removed from the oscillating wave generated by the negative resistance element 1. Since the stabilizing resistor 5, disposed at a position which is at a distance $l$ from both the mount 2 and the resonator 4 (where $l$ is equal to one-fourth of the wavelength of the center frequency), imparts stable and high external Q load characteristics for the oscillation, the oscillating wave has desirable characteristics. The feature of this prior art circuit is the use of the stabilizing resistor 5, and stable oscillation is maintained by this resistor 5; however, the use of this resistor 5 also causes a definite disadvantage. Even though a lumped constant element having a broad band characteristic equal to the characteristic impedance of the line is preferable as the stabilizing resistor 5, it is very difficult in practice to manufacture a resistor of this type for use in the microwave and milliwave range, and its settling method is also difficult. Further, such a resistor introduces a power loss, especially in the ultra high frequency range, which makes it difficult to obtain high power output oscillations.

SUMMARY OF THE INVENTION

The object of the present invention is to eliminate such disadvantages of the prior art and to provide a stable and low noise high power oscillator.

DETAILED DESCRIPTION OF THE PREFERRED EMBODIMENT

The present invention will now be described with respect to one embodiment thereof.

Figure 1:
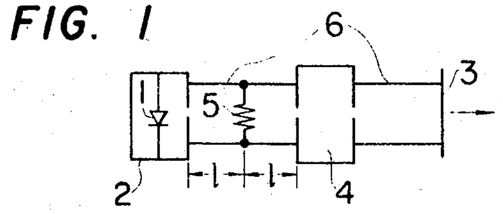
FIG. 1 is a schematic view showing a conventional negative resistance oscillator.
Figure 2:
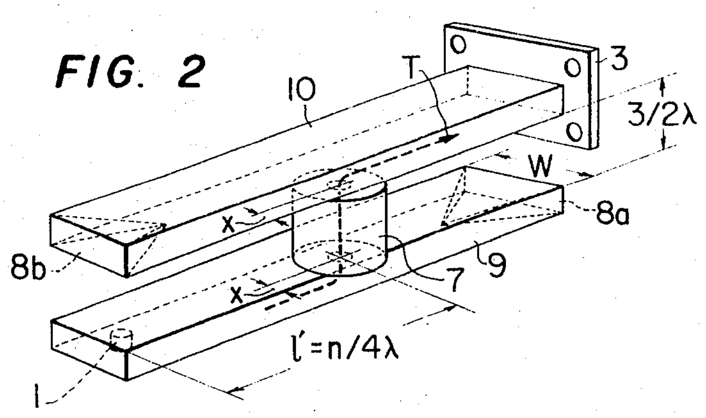
FIG. 2 is a perspective view showing one embodiment of the present invention.

FIG. 2 is a schematic sectional view of one embodiment of the present invention. In FIG. 2, numeral 1 designates a negative resistance oscillating element, 3 an output terminal, 7 a high Q transmission type cylindrical resonator, 8*a* and 8*b* non-reflecting pyramid-shaped dummy terminals, and 9 and 10 rectangular waveguides. FIGS. 1 and 2 use the same reference numerals to identify corresponding elements.

The waveguides 9 and 10 and the resonator 7 are electrically coupled together at a point which is at a distance $l'$ from the element 1, where $l'$ is equal to one-fourth of the wavelength of oscillation multiplied by a specific integer. This coupling point is on the center line of the two coupling holes on the opposite ends of the resonator. The distance $x$ between this coupling point and the front edge of each waveguide is equal to $W/\pi \cot^{-1}(2W/\lambda)$ where W is the width of the waveguide surfaces which are coupled to the opposite ends of the resonator, so that the resonator has a directivity in the direction indicated by the arrow T. $\lambda$ is the wavelength of the center oscillating frequency. The length of resonator 7 is shown as $3/2\lambda$. The frequency components, i.e. the noise components, different from the resonating frequency $fo$ of the resonator 7 are absorbed by the non-reflecting terminals 8*a* and 8*b* and do not reach the output terminal 3. However, the generated signal wave frequency component equal to the resonating frequency $fo$ of the resonator 7 has the directivity T and is passed by resonator 7 to the output 3 without any loss at the terminals 8*a* and 8*b*.

The stability of the negative resistance element 1 for the oscillation is determined by the load characteristic of the resonator 7 seen from the element 1. The characteristic of the load seen from the coupling point of the resonator 7 and waveguide 9 has the locus A on the Smith chart shown in FIG. 3 (when the distance between the point and element 1 is $n\lambda/4$); that is, as the frequency increases, the locus of the characteristic rotates in the direction as designated by the arrow. It can be seen that this characteristic is in the vicinity of the matching point at the resonating frequency $fo$ of the resonator 7, and as the frequency moves away from $fo$, the characteristic also first moves away from the matching point, but again approaches the vicinity of the matching point when the frequency moves further from $fo$. However, since the overall locus A is concentrated near the matching point, it does not impart a large load variation to the negative resistance element 1, and stable oscillation is maintained. If the coupling point is displaced from $n\lambda/4$ distance from the negative resistance element, the locus of the characteristic is also displaced laterally rightwardly and leftwardly in FIG. 3. Incidentally, the size of the locus A in FIG. 3 may be adjusted, for example, by the degree of the coupling of the waveguide 9 and the resonator, or by providing a reflector, such as a screw, in the waveguide 10. G is conductance, and B is susceptance.

Figures 3, 4, 5:
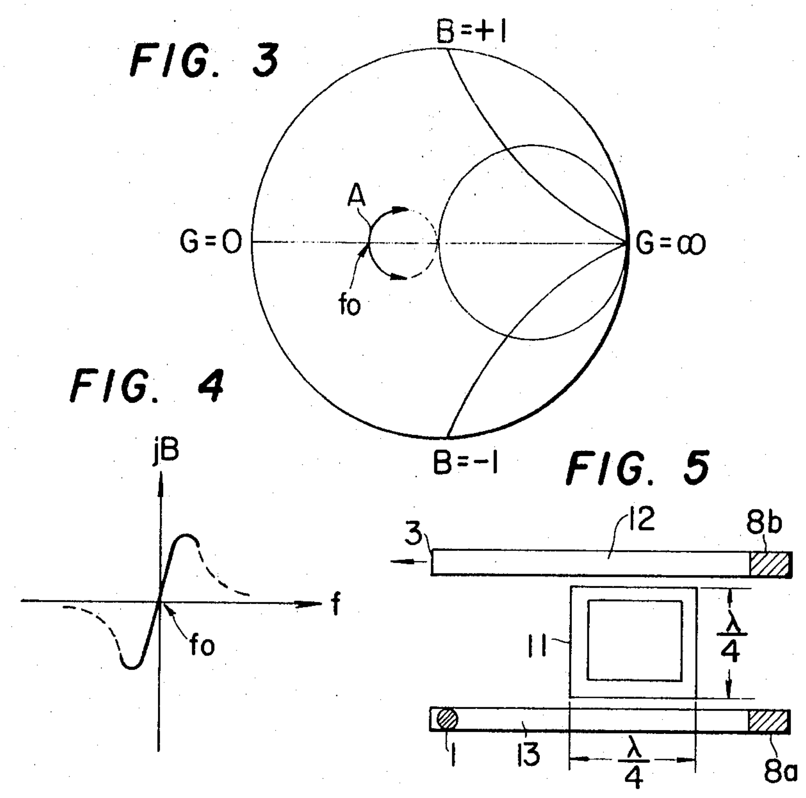
FIGS. 3 and 4 are graphs for describing the operation of the oscillator shown in FIG. 2.
FIG. 5 is a schematic sectional view of another embodiment of the present invention.

The susceptance in the vicinity of the resonating frequency *fo* varies as shown in FIG. 4; that is, as *fo* increase, the susceptance *j*B changes abruptly from negative to positive. Therefore, the negative characteristic of the negative resistance element 1 becomes a very high external Q value, thereby producing a preferable oscillation wave having high stability against frequency variation. If another resonating circuit is added to the very vicinity of the negative resistance element 1, lower noise may be provided; but, it is better not to use the resonating circuit in view of the stability of the jump, etc., of the oscillating frequency.

FIG. 5 is a schematic sectional view showing another embodiment of the present invention incorporating strip transmission lines. Numeral 1 designates a negative resistance element, 3 an output terminal, 8*a* and 8*b* non-reflecting terminals, 11 a line resonator whose total line length equals the wavelength λ of the central frequency, 12 and 13 lines. The resonator 11 is made to have a directional characteristic by making its individual line lengths equal to λ/4 and by coupling these lines in the length of λ/4 to the lines 12 and 13. In this case, there is produced an oscillator of high stability and low noise characteristics by the same operation as described above.

It should be easily understood by those skilled in the art that a plurality of the aforementioned cavity or loop resonators may be provided. More particularly, the two transmission lines may be coupled by plural resonators.

When an oscillator as shown in FIG. 2 or FIG. 5 is used as a local oscillator in a receiver, the non-reflecting terminal 8*b* is removed, and the received signal is introduced to the resulting opening in the end of the line, whereby the mixed signal is coupled to the output terminal 3.

Therefore, the present invention provides an oscillator of very high stability and low noise so as to provide a signal source of preferable characteristics in the microwave and milliwave ranges.

While the invention has been particularly shown and described with reference to the preferred embodiment thereof, it will be understood by those skilled in the art that various changes in form and details may be made therein without departing from the spirit and scope of the invention.

We claim:

1. A negative resistance oscillator for producing an oscillating signal and comprising a negative resistance means for generating oscillations at a frequency $f_o$, a first line connected at one end thereof with a load, a second line connected at one end thereof with a non-reflecting terminal, and at the other end thereof with said negative resistance means, directional resonator means disposed between said first and second lines and having a resonating frequency $f_o$ for directionally coupling energy at said resonating frequency $f_o$ generated by said negative resistance means to said load, the distance between said negative resistance means and the electric coupling point of said directional resonator means with said second line being equal to an integer multiple of one-fourth of the wavelength of the signal.

2. A negative resistance oscillator according to claim 1 comprising another non-reflecting terminal connected to the other end of said first line.

3. A negative resistance oscillator according to claim 1 wherein said first and second lines are first and second waveguides, respectively; and wherein said directional resonator means is a cylindrical resonator having two coupling holes on the opposite ends thereof, said first and second waveguides having corresponding coupling holes in alignment therewith, said coupling point being on a center line of said coupling holes transverse to said first and second waveguides, the distance between said coupling point and the edge of said second waveguide being equal to $W/\pi \cot^{-1}(2W/\lambda)$, where W is the width of the waveguide, and λ is the wavelength of the center frequency $f_o$ of the oscillator.

* * * * *